(12) United States Patent
Chuang et al.

(10) Patent No.: US 8,981,530 B2
(45) Date of Patent: Mar. 17, 2015

(54) SEMICONDUCTOR DEVICE AND METHOD OF FORMING THE SAME

(71) Applicant: Taiwan Semiconductor Manufacturing Company, Ltd., Hsin-Chu (TW)

(72) Inventors: Harry-Hak-Lay Chuang, Singapore (SG); Ming Zhu, Singapore (SG)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 29 days.

(21) Appl. No.: 13/672,436

(22) Filed: Nov. 8, 2012

(65) Prior Publication Data
US 2014/0124869 A1    May 8, 2014

(51) Int. Cl.

| | | |
|---|---|---|
| *H01L 21/8234* | (2006.01) | |
| *H01L 27/088* | (2006.01) | |
| *H01L 21/322* | (2006.01) | |
| *H01L 21/8238* | (2006.01) | |
| *H01L 29/04* | (2006.01) | |
| *H01L 29/08* | (2006.01) | |
| *H01L 29/66* | (2006.01) | |
| *H01L 29/78* | (2006.01) | |

(52) U.S. Cl.
CPC ...... *H01L 21/823807* (2013.01); *H01L 21/322* (2013.01); *H01L 21/823814* (2013.01); *H01L 29/045* (2013.01); *H01L 29/0847* (2013.01); *H01L 29/66636* (2013.01); *H01L 29/78* (2013.01); *H01L 29/7843* (2013.01); *H01L 29/7848* (2013.01)
USPC 257/617; 257/368; 257/E27.06; 257/E21.616; 438/275; 438/276

(58) Field of Classification Search
USPC ............... 257/368, 617, E27.06, E21.616; 438/275, 276
See application file for complete search history.

(56) References Cited

U.S. PATENT DOCUMENTS

| | | | | |
|---|---|---|---|---|
| 2007/0254444 | A1* | 11/2007 | Bloomquist et al. | 438/305 |
| 2012/0211839 | A1* | 8/2012 | Golonzka et al. | 257/369 |
| 2013/0178029 | A1* | 7/2013 | Wang et al. | 438/285 |
| 2014/0048886 | A1* | 2/2014 | Chuang et al. | 257/369 |

* cited by examiner

*Primary Examiner* — Victor A Mandala
(74) *Attorney, Agent, or Firm* — Slater & Matsil, L.L.P.

(57) ABSTRACT

A semiconductor device includes a first NMOS device with a first threshold voltage and a second NMOS device with a second threshold voltage. The first NMOS device includes a first gate structure over a semiconductor substrate, first source/drain (S/D) regions in the semiconductor substrate and adjacent to opposite edges of the first gate structure. The first S/D regions are free of dislocation. The second NMOS device includes a second gate structure over the semiconductor substrate, second S/D regions in the semiconductor substrate and adjacent to opposite edges of the second gate structure, and a dislocation in the second S/D regions.

19 Claims, 6 Drawing Sheets

SEMICONDUCTOR DEVICE AND METHOD OF FORMING THE SAME

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as semiconductor devices, such as a metal-oxide-semiconductor field-effect transistors (MOSFETs), are scaled down through various technology nodes, strained source/drain features (e.g., stressor regions) have been implemented to enhance carrier mobility and improve device performance. Although existing approaches to forming stressor regions for IC devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
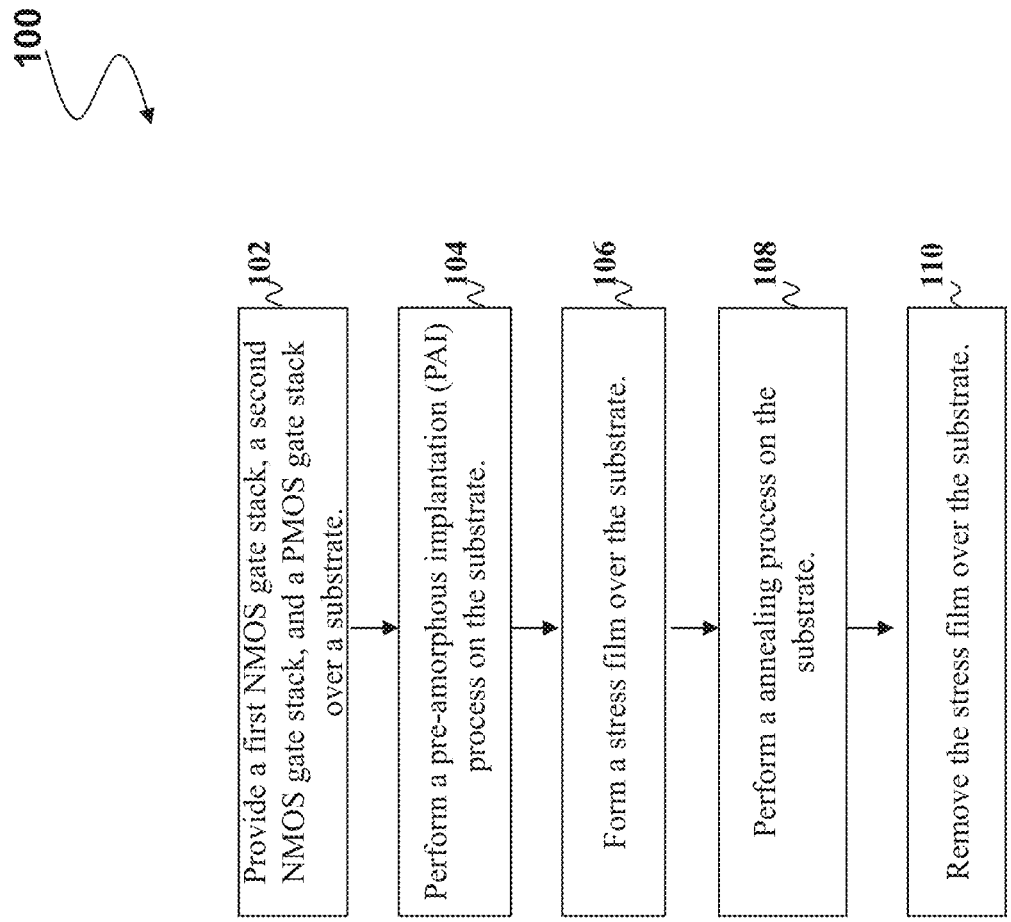
FIG. 1 is a flowchart illustrating a method of forming a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that those skilled in the art will be able to devise various equivalents that, although not explicitly described herein, embody the principles of the present invention.

Examples of devices that can benefit from one or more embodiments of the present invention are semiconductor devices with field effect transistors (FET). Such a device, for example, is a complementary metal-oxide-semiconductor (CMOS) field effect transistor. The following disclosure will continue with this example to illustrate various embodiments of the present application. It is understood, however, that the present application should not be limited to a particular type of device, except as specifically claimed.

With reference to FIGS. 1 and 2-6, a method 100 and a semiconductor device 200 are collectively described below. The semiconductor device 200 refers to an integrated circuit, or a portion thereof, that can comprise active devices such as metal-oxide-semiconductor field effect transistors (MOSFETs), complementary metal-oxide-semiconductor (CMOS) transistors, high voltage transistors, and/or high frequency transistors; other suitable components; and/or combinations thereof. The semiconductor device 200 may additionally include passive components, such as resistors, capacitors, inductors, and/or fuses. It is understood that the semiconductor device 200 may be formed by CMOS technology processing, and thus some processes are not described in detail herein. Additional steps can be provided before, during, or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Referring to FIG. 1, a method 100 for fabricating a semiconductor device is described according to various aspects of the present disclosure. The method 100 begins with step 102 in which a first NMOS gate stack, a second NMOS gate stack, and a PMOS gate stack are formed over a substrate. The method 100 continues with step 104 in which a pre-amorphous implantation (PAI) process is performed on the substrate. The method 100 continues at step 106 in which a stress film is deposited over the substrate. The method 100 continues at step 108 in which an annealing process is performed on the substrate. The method 100 continues at step 110 in which the stress film is removed from the substrate. The discussion that follows illustrates various embodiments of a semiconductor device 200 that can be fabricated according to the method 100 of FIG. 1.

Figure 2:
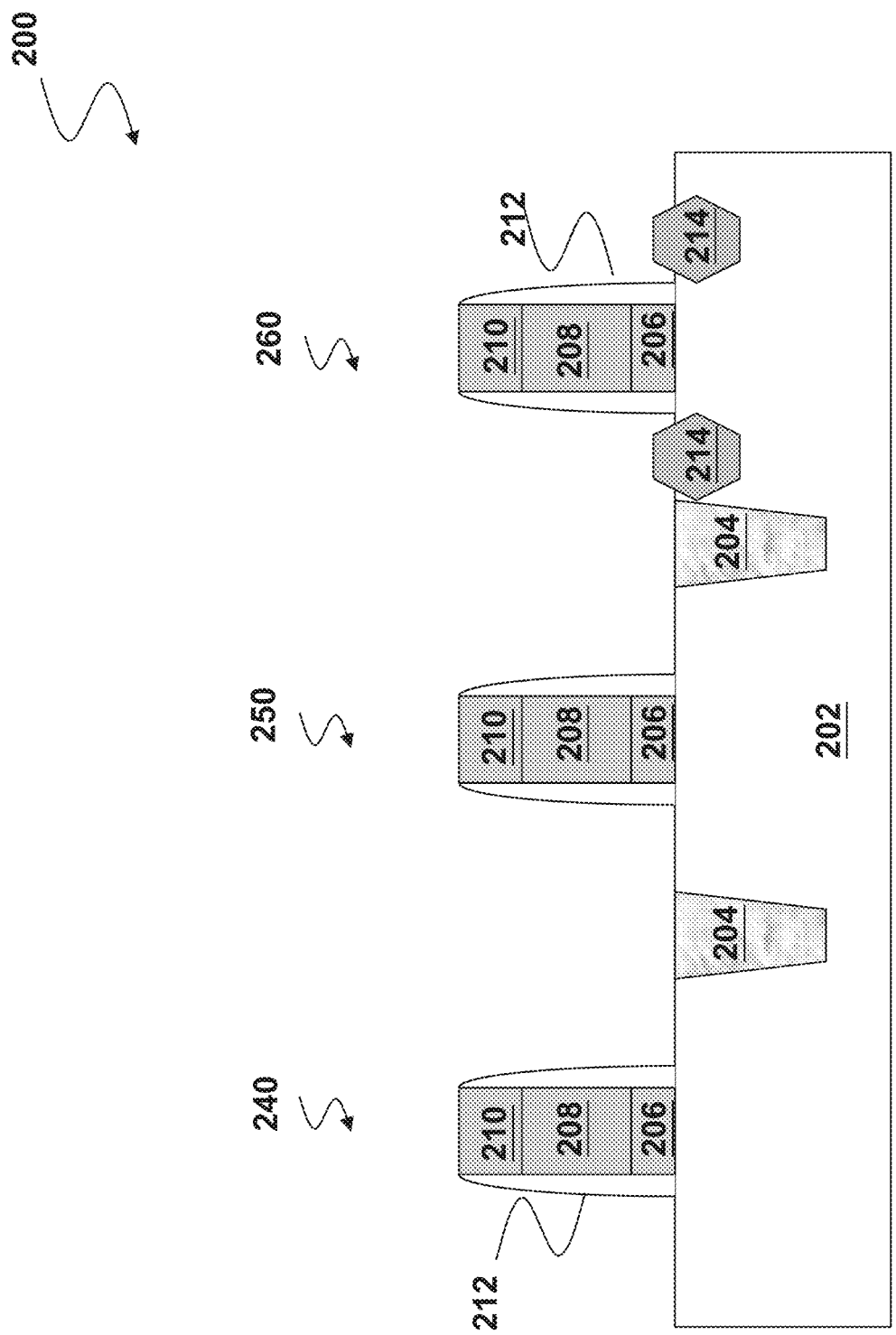
FIGS. 2 to 6 are cross-sectional side views of a semiconductor device at various stages of fabrication according to the method of FIG. 1 in accordance with one or more embodiments.

FIGS. 2 to 6 are cross-sectional side views of the semiconductor device 200 at various stages of fabrication according to the method 100 of FIG. 1. Referring to FIGS. 1 and 2, the method 100 begins at step 102, wherein a first NMOS gate stack 240, a second NMOS gate stack 250, and a PMOS gate stack 260 are formed over a substrate 202. Each of the first NMOS gate stack 240, the second NMOS gate stack 250, and the PMOS gate stack 260 defines a channel region of the substrate 202 thereunder. In the present embodiment, the first NMOS gate stack 240 is preserved for forming a NMOS device with low leakage current. The NMOS device with low leakage current, for example, includes standard threshold voltage transistor (SVT) with a standard threshold voltage (e.g., 0.3 volts) and/or high threshold voltage transistor (HVT) with a high threshold voltage (e.g., 0.4 volts). In the present embodiment, the second NMOS gate stack 250 is preserved for forming a NMOS device with high operation speed. The NMOS device with high operation speed, for example, includes low threshold voltage transistor (LVT) with a low threshold voltage (e.g., 0.2 volts) and/or ultra-low threshold voltage transistor (uLVT) with a lower threshold voltage (e.g., <0.2 volts).

In the present embodiment, the substrate 202 is a semiconductor substrate including silicon. In some alternative embodiments, the substrate 202 includes an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Where the substrate 202 is an alloy semiconductor, the alloy semiconductor substrate could have a gradient SiGe feature in which the Si and Ge composition change from one ratio at one location to another ratio at another location of the gradient SiGe feature. The alloy SiGe could be formed over a silicon substrate, and/or the SiGe substrate may be strained. In yet another alternative embodiment, the semiconductor substrate could be a semiconductor on insulator (SOI).

The substrate 202 includes various doped regions depending on design requirements as known in the art (e.g., p-type wells or n-type wells). The doped regions are doped with p-type dopants, such as boron or $BF_2$, and/or n-type dopants, such as phosphorus or arsenic. The doped regions may be formed directly on the substrate 202, in a P-well structure, in an N-well structure, in a dual-well structure, or using a raised structure. In some embodiments, the substrate 202 includes isolation features 204 to define and isolate various active regions of the substrate 202. The isolation features 204 utilize isolation technology, such as shallow trench isolation (STI) or local oxidation of silicon (LOCOS), to define and electrically isolate the various regions. The isolation features 204 include silicon oxide, silicon nitride, silicon oxynitride, other suitable materials, or combinations thereof.

Still referring to FIG. 2, in some embodiments, the first NMOS gate stack 240, the second NMOS gate stack 250, and the PMOS gate stack 260 are formed by sequentially depositing and patterning a gate dielectric layer 206, a gate electrode layer 208, and a hard mask layer 210 on the substrate 202. The gate dielectric layer 206, in one example, is a thin film comprising silicon oxide, silicon nitride, silicon oxynitride, high-k dielectrics, other suitable dielectric materials, or combinations thereof. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 206 is a high-k dielectric layer with a thickness in the range of about 10 angstroms to about 30 angstroms. The gate dielectric layer 206 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 206 may further comprise an interfacial layer (not shown) to reduce damage between the gate dielectric layer 206 and the substrate 202. The interfacial layer may comprise silicon oxide.

The gate electrode layer 208 is then formed on the gate dielectric layer 206. In some embodiments, the gate electrode layer 208 includes a single layer or multilayer structure. In the present embodiment, the gate electrode layer 208 comprises polysilicon. Further, the gate electrode layer 208 may be doped polysilicon with the same or different doping species. In one embodiment, the gate electrode layer 208 has a thickness in the range of about 30 nm to about 60 nm. The gate electrode layer 208 may be formed using a process such as low-pressure chemical vapor deposition (LPCVD), plasma enhanced chemical vapor deposition (PECVD), other suitable processes, or combinations thereof. Next, the hard mask layer 210 is formed over the gate electrode layer 208 and a patterned photo-sensitive layer (not shown) is formed on the hard mask layer 210. The pattern of the photo-sensitive layer is transferred to the hard mask layer 210 and then transferred to the gate electrode layer 208 and the gate dielectric layer 206 to form the first NMOS gate stack 240, the second NMOS gate stack 250, and the PMOS gate stack 260. In some embodiments, the hard mask layer 210 includes silicon oxide. In alternative embodiments, the hard mask layer 210 includes silicon nitride, silicon oxynitride, and/or other suitable dielectric materials, and may be formed using a method such as CVD or PVD. The hard mask layer 210 has a thickness in the range from about 100 angstroms to about 800 angstroms. The photo-sensitive layer is removed thereafter by a dry and/or wet stripping process.

With further referring to FIG. 2, sidewall spacers (or referred to gate spacers) 212 are formed adjoining opposite sidewalls of the first NMOS gate stack 240, the second NMOS gate stack 250, and the PMOS gate stack 260. In some embodiments, the sidewall spacers 212 include a single-layer or a multiple-layer structure. In the present embodiment, a blanket layer of spacer material (not shown) is formed over the NMOS gate stack 240, the PMOS gate stack 250, and the substrate 202 by a depositing process including CVD, PVD, ALD, or other suitable techniques. In some embodiments, the spacer material comprises silicon oxide, silicon nitride, silicon oxy-nitride, other suitable material, or combinations thereof. In some embodiments, the deposited layer of spacer material has a thickness ranging from about 10 angstroms to about 60 angstroms. Then, an anisotropic etching process is performed on the spacer material to form the sidewall spacers 212. The sidewall spacers 212 can protect the sidewalls of the first NMOS gate stack 240, the second NMOS gate stack 250, and the PMOS gate stack 260. Alternatively, the sidewall spacers 212 can be used to offset subsequently formed doped regions, such as heavily doped source/drain regions.

In some embodiments, source/drain (S/D) features 214 are formed in the substrate 202 adjacent to edges of the PMOS gate stack 260. In some embodiments, the source/drain features 214 have a top surface higher than the top surface of the substrate 202. In some embodiments, the source/drain features 214 have a top surface higher than the top surface of the substrate 202 with a height difference ranging between about 1 nm and about 10 nm. In alternative embodiments, the source/drain features 214 have a top surface substantially coplanar with the top surface of the substrate 202. In some embodiments, the source/drain features 214 are formed starting at forming recess cavities (not shown) in the substrate 202, then growing a strained material in the recess cavities. In some embodiments, the strained material is grown using a process including selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epi processes, or combinations thereof. In some embodiments, the strained material has a lattice constant different from the substrate 202 to induce a strain or stress on the channel region of the semiconductor device 200, and therefore enable carrier mobility of the device to enhance the device performance.

Figure 3:
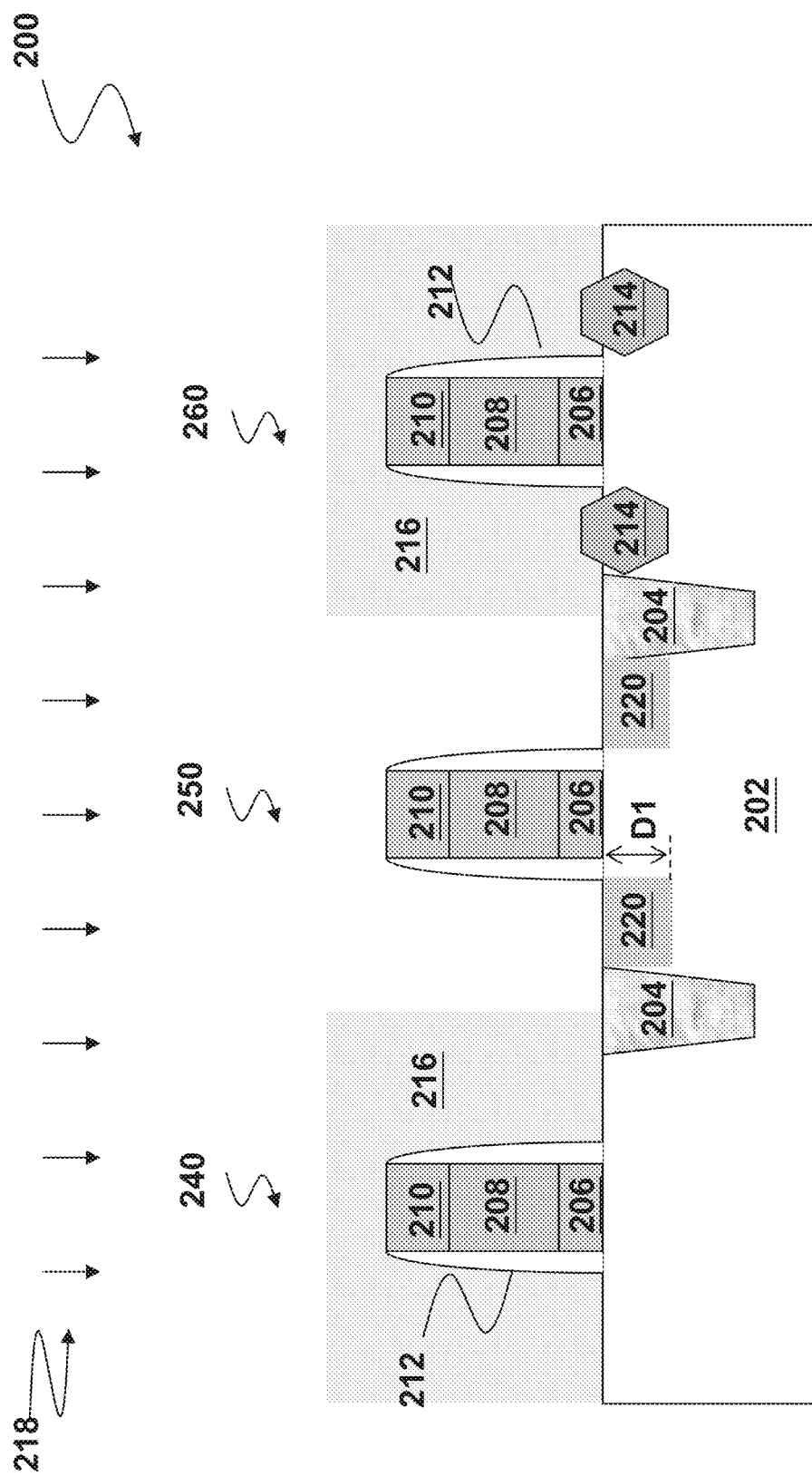

Referring to FIGS. 1 and 3, the method 100 proceeds to step 104, wherein a pre-amorphous implantation (PAI) process 218 is performed on the substrate 202. In some embodiments, the PAI process 218 implants the substrate 202 and causes damage to the lattice structure of the substrate 202 to form amorphized regions 220. In the present embodiment, the amorphized regions 220 are formed in source/drain (S/D) regions adjacent to the opposite edges of the second NMOS gate stack 250. The amorphized regions 220 have a depth D1 (measured from an upper surface of the substrate 202). The depth D1 is formed according to design specifications. The depth D1, in some embodiments, ranges from about 10 nanometers to about 150 nanometers. In the present embodiment, the depth D1 is less than about 100 nanometers. The depth D1 can be controlled by the thickness of the sidewall spacers 212 because the sidewall spacers 212 serve to concentrate the PAI process 218 implantation energy. Also, the depth D1 can be controlled by the PAI process 218, such as implant energy, implant species, and/or implant dosage. In at least one embodiment, the PAI process 218 implants the substrate 202 with silicon (Si) or germanium (Ge). In an alternative embodiment, the PAI process 218 could utilize other implant species, such as Ar, Xe, C, $BF_2$, As, In, other suitable implant species, or combinations thereof. In the present embodiment, the PAI process 218 implants Si or Ge at an implant energy ranging from about 15 KeV to about 50 KeV, and an implant dosage ranging from about $1 \times 10^{14}$ atoms/cm$^2$ to about $2 \times 10^{15}$ atoms/cm$^2$, depending on the implantation temperature. In at least one embodiment, the PAI process 218 is performed at room temperature (e.g. 25° C.). In an alternative embodiment, the PAI process 218 is performed at a low temperature (e.g., −60° C. to −100° C.) by adapting a Cryo (low temperature) function in the ion implanter to enhance the efficiency of implant amorphization. In some embodiments, the PAI process 218 is performed with a tilt angle ranging from about 0 degree to about 20 degrees.

In some alternative embodiments, the PAI process 218 can be a multiple-step implantation process, including at least a first step and a second step of the implantation process. The first and the second steps of the implantation process are performed using a first and a second implant energy levels, a first and a second implant dosages, and a first and a second implant tilt angles, respectively. In at least one embodiment, the first and the second implant energy levels range from about 15 KeV to about 50 KeV. In another embodiment, the first implant energy level is greater than the second implant energy level. In at least one embodiment, the first and the second implant dosages range from about $1 \times 10^{14}$ atoms/cm$^2$ to about $2 \times 10^{15}$ atoms/cm$^2$. In another embodiment, the first implant dosage is greater than the second implant dosage. In some embodiments, a combined dosage of the first and the second implant dosages range from about $1 \times 10^{14}$ atoms/cm$^2$ to about $2 \times 10^{15}$ atoms/cm$^2$, and a ratio between the first and the second implant dosages ranges from about 1:1 to about 7:3. In one embodiment, the first and the second tilt angles range from about 0 degree to about 20 degrees. In another embodiment, the first implant tilt angle is greater than the second implant tilt angle.

In the present embodiment, the first NMOS gate stack 240 and the PMOS gate stack 260 are covered by protectors 216 during the PAI process 218 such that no amorphized regions formed adjacent to edges of the first NMOS gate stack 240 or the PMOS gate stack 260. In some embodiments, the protectors 216 is a patterned photoresist layer or hard mask layer. Hence, a leakage source for the first NMOS gate stack 240 resulted by the PAI process 218 which damages the substrate 202 may be prevented, thereby minimizing the leakage current of the first NMOS gate stack 240. The protectors 216 are then removed after the PAI process 218 by, for example, an etching process or stripping process.

Figure 4:
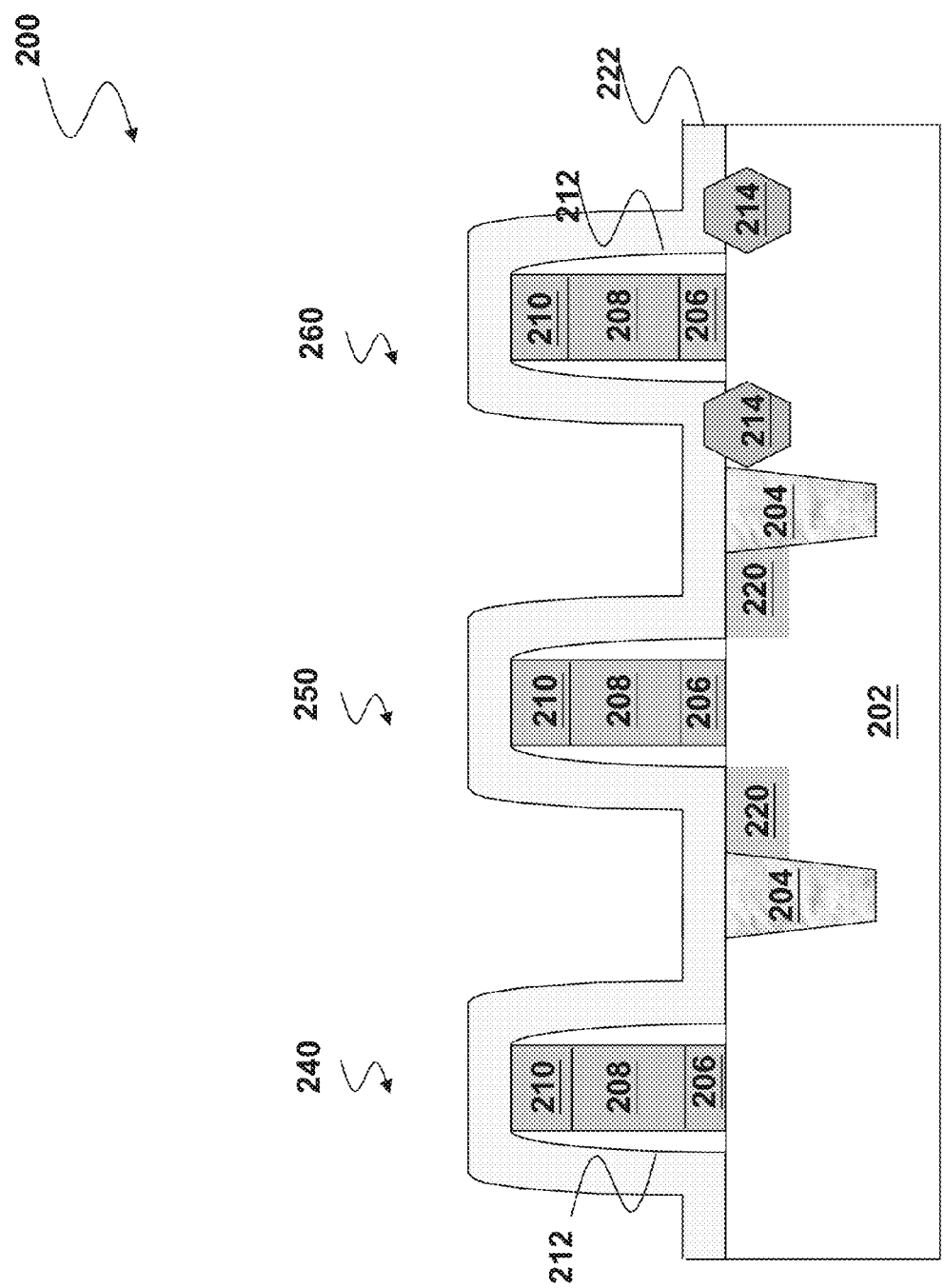

Referring to FIGS. 1 and 4, the method 100 proceeds to step 106 wherein a stress film 222 is deposited over the first NMOS gate stack 240, the second NMOS gate stack 250, the PMOS gate stack 260, and the substrate 202. The stress film 222 may be formed by chemical vapor deposition (CVD), physical vapor deposition (PVD), atomic layer deposition (ALD), high density plasma CVD (HDPCVD), plating, other suitable methods, and/or combinations thereof. The stress film 222 includes a dielectric material. In some embodiments, the stress film 222 includes silicon nitride, silicon oxynitride, SiCN, and/or combinations thereof. In alternative embodiments, the stress film 222 includes silicon oxide. In some embodiments, the stress film 222 has a thickness greater than the thickness of the spacer material for forming the sidewall spacers 212. In some embodiments, the stress film 222 has a thickness ranging from about 100 angstroms to about 300 angstroms. In some embodiments, the stress film 222 is used to provide tensile stress in a subsequent annealing process which recrystallizes the amorphized regions 220.

Figure 5:
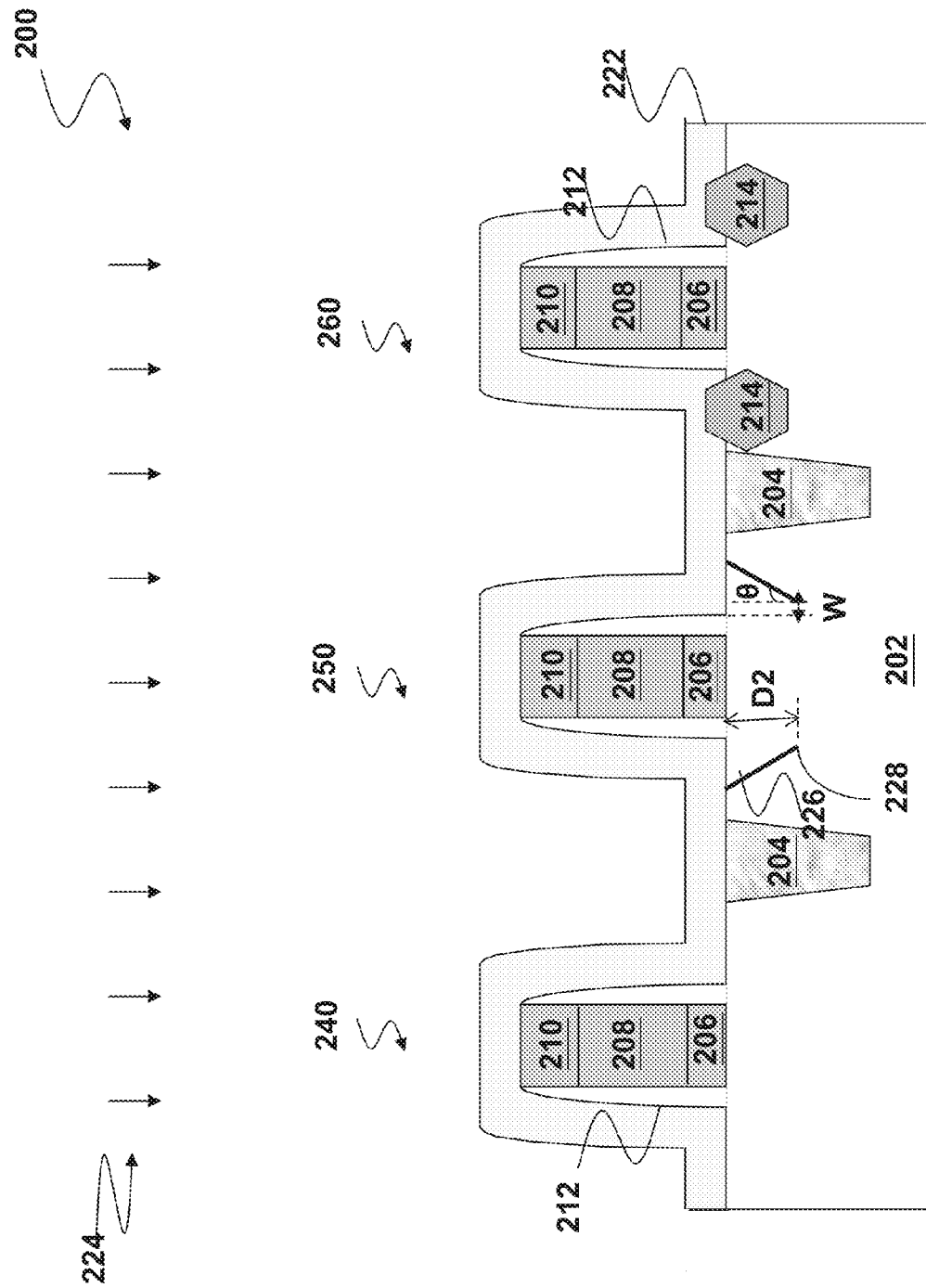

Referring to FIGS. 1 and 5, the method 100 proceeds to step 108 wherein an annealing process 224 is performed on the substrate 202. In some embodiments, the annealing process 224 is a rapid thermal annealing (RTA) process, spike RTA process, or a millisecond thermal annealing (MSA) process (e.g., millisecond laser thermal annealing process). In at least one embodiment, the annealing process 224 includes a RTA process performed at a temperature ranging from about 600° C. to about 750° C., lasting for a period of time ranging from about 10 seconds to about 5 minutes. In an alternative embodiment, the annealing process 224 includes a spike RTA process performed at a temperature ranging from about 990° C. to about 1050° C., lasting for a period of time ranging from about 0.1 seconds to about 2 seconds. In alternative embodiments, the annealing process 224 may further include a pre-heat step to minimize (or even eliminate) the end of range (EOR) defects. In some embodiments, the pre-heat step may be performed at a temperature ranging from about 400° C. to about 700° C. In some embodiments, the pre-heat step may be performed for a period of time ranging from about 10 seconds to about 5 minutes. In the present embodiment, the pre-heat step is performed at a temperature of about 550° C. lasting for about 30 seconds.

During the annealing process 224, as the amorphized regions 220 being re-crystallized, dislocations 226 of the re-crystallized counterpart of the amorphized regions 220 are formed in the substrate 202. In some embodiments, the dislocations 226 are formed adjacent to opposite edges of the second NMOS gate stack 250. In some embodiments, the substrate 202 is referred to as a (100) substrate and the dislocations 226 are formed along a <111> direction. In some embodiments, the <111> direction has an angle θ, measured with respect to a reference level vertical to the surface of the substrate 202, ranging from about 25 degrees to about 45 degrees. In the present embodiment, the dislocations 226 have <111> direction with the angle θ of about 35 degrees. The dislocations 226 are formed starting at pinchoff points 228. The pinchoff points 228 have a depth D2 measured from the upper surface of the substrate 202. In some embodiments, the depth D2 of the pinchoff points 228 ranges from about 10 nanometers to about 150 nanometers. In the present embodiment, the depth D2 of the pinchoff points 228 ranges from about 10 nanometers to about 30 nanometers. The pinchoff points 228 have a horizontal buffer (proximity) W measured from an adjacent gate edge of the second NMOS gate stack 250. The horizontal buffer W and the depth D2 are formed according to design specifications and are a function of the annealing process 224. In some embodiments, the horizontal buffer W of the pinchoff points 228 ranges from about −5 nanometers to about 10 nanometers ("−" represents the pinchoff points 224 are under the NMOS gate stack 240 or the PMOS gate stack 250.). The pinchoff points 228 may be formed such that they are not disposed within the channel region in the substrate 202 defined by the second NMOS gate stack 250.

Figure 6:
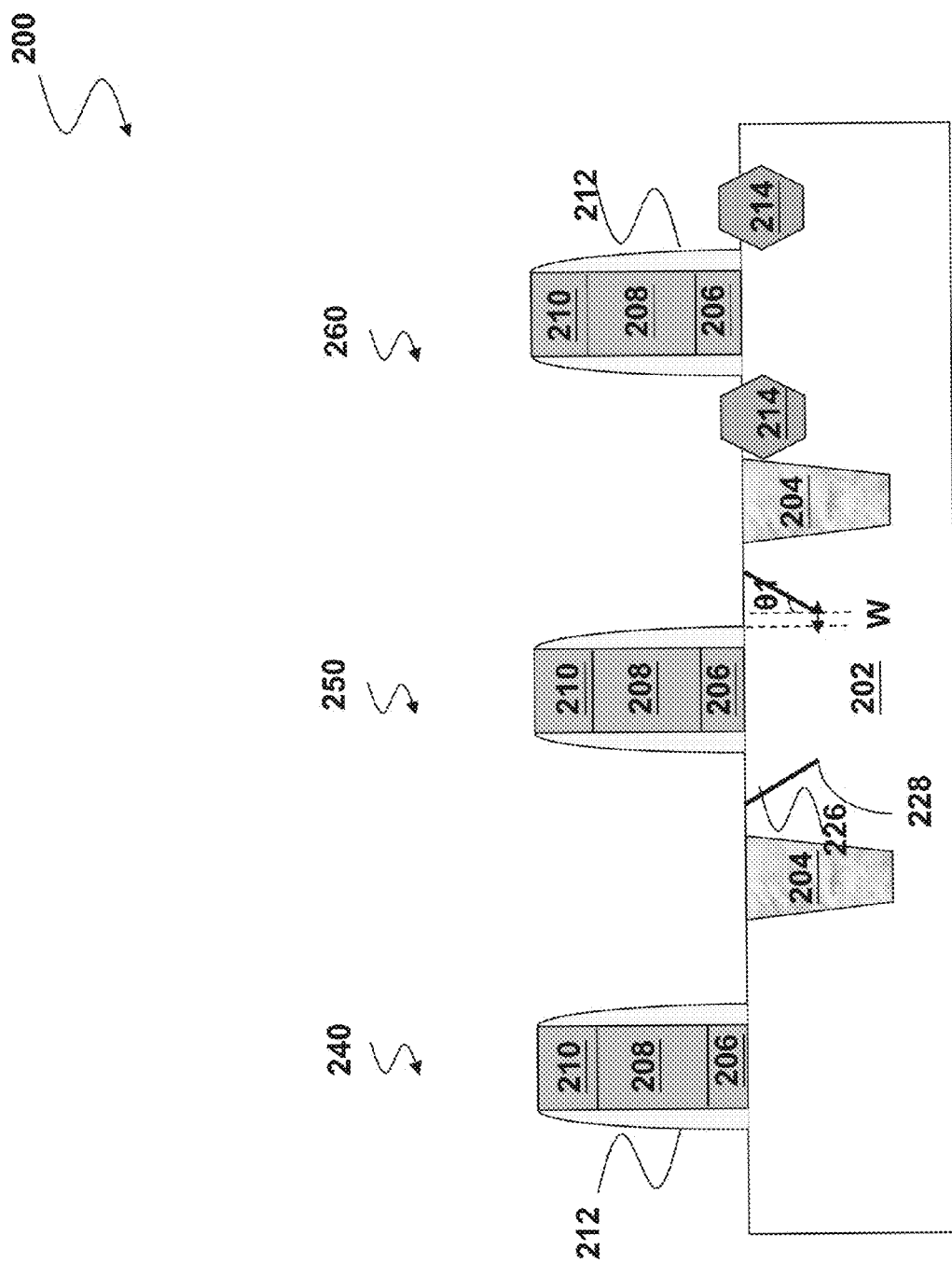

Referring to FIGS. 1 and 6, the method 100 proceeds to step 110 wherein the stress film 222 is removed from the substrate 202. The stress film 222 is removed, for example, by a wet etching using phosphoric acid or hydrofluoric acid, or by a dry etching using suitable etchant.

A benefit of the dislocations for the NMOS gate stacks, in accordance with the disclosed embodiments, is that the dislocations formed within the active region (e.g., source/drain) for the NMOS devices, such as low threshold voltage transistor (LVT) and/or ultra-low threshold voltage transistor (uLVT), may improve the stress within the channel region of the NMOS gate stack to increase device operation speed. Moreover, the process for preventing the formation of the dislocations within the active region (e.g., source/drain) for the NMOS devices, such as standard threshold voltage transistor (SVT) and/or high threshold voltage transistor (HVT), may improve the device performance by preventing from the increasing of leakage current. Thus, the disclosed embodiments provide increased stress level in the channel region to improve carrier mobility of one NMOS device required high operation speed without adding leakage source to another NMOS device required low leakage current. It is understood that different embodiments may have different advantages, and that no particular advantage is necessarily required of any embodiment.

The semiconductor device may undergo further CMOS or MOS technology processing to form various features. For example, the method 100 may proceed to form main spacers. Contact features, such as silicide regions, may also be formed. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features can be formed by a process that includes depositing a metal layer, annealing the metal layer such that the metal layer is able to react with silicon to form silicide, and then removing the non-reacted metal layer. An inter-level dielectric (ILD) layer can further be formed on the substrate and a chemical mechanical polishing (CMP) process is further applied to the substrate to planarize the substrate. Further, a contact etch stop layer (CESL) may be formed on top of the gate structure before forming the ILD layer.

In an embodiment, the first NMOS gate stack 240, the second NMOS gate stack 250, and the PMOS gate stack 260 remain polysilicon in the final device. In another embodiment, a gate replacement process (or gate last process) is performed, where the first polysilicon NMOS gate stack 240, the second polysilicon NMOS gate stack 250, and the polysilicon PMOS gate stack 260 are replaced with a metal gate. For example, a metal gate may replace the gate stack (i.e., polysilicon gate stack) of the first NMOS gate stack 240, the second NMOS gate stack 250, and the PMOS gate stack 260. The metal gate includes liner layers, work function layers, conductive layers, metal gate layers, fill layers, other suitable layers, and/or combinations thereof. The various layers include any suitable material, such as aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

Subsequent processing may further form various contacts/vias/lines and multilayer interconnect features (e.g., metal layers and interlayer dielectrics) on the substrate, configured to connect the various features or structures of the semiconductor device. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The disclosed semiconductor device may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

In one embodiment, a semiconductor device includes a first NMOS device with a first threshold voltage and a second NMOS device with a second threshold voltage. The first NMOS device includes a first gate structure over a semiconductor substrate, first source/drain (S/D) regions in the semiconductor substrate and adjacent to opposite edges of the first gate structure. The first S/D regions are free of dislocation. The second NMOS device includes a second gate structure over the semiconductor substrate, second S/D regions in the semiconductor substrate and adjacent to opposite edges of the second gate structure, and a dislocation in the second S/D regions.

In another embodiment, a semiconductor device includes a first NMOS device, a second NMOS device, and a PMOS device. The first NMOS device includes a first gate structure over a semiconductor substrate, and first source/drain (S/D) regions in the semiconductor substrate and adjacent to opposite edges of the first gate structure. The first S/D regions are free of dislocation. The second NMOS device includes a second gate structure over the semiconductor substrate, second S/D regions in the semiconductor substrate and adjacent to opposite edges of the second gate structure, and a dislocation in the second S/D regions. A threshold voltage of the first NMOS device is greater than a threshold voltage of the second NMOS device. The PMOS device includes a third gate structure over the semiconductor substrate, and third source/drain (S/D) regions in the semiconductor substrate and adjacent to opposite edges of the third gate structure. The third S/D regions are free of dislocation.

In still another embodiment, a method for forming a semiconductor device, includes forming a first NMOS gate structure and a second NMOS gate structure over a substrate, forming a protector over the first NMOS gate structure, forming an amorphized region in the substrate adjacent to the second NMOS gate structure, depositing a stress film over the first and the second NMOS gate structures, performing an annealing process to form a dislocation in the substrate adjacent to the second NMOS gate structure, and removing the stress film.

The above disclosure provides many different embodiments, or examples, for implementing different features of the invention. Specific examples of components and arrangements are described above to simplify the present disclosure. These are, of course, merely examples and are not intended to be limiting. Accordingly, the components disclosed herein may be arranged, combined, or configured in ways different from the exemplary embodiments shown herein without departing from the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first NMOS device with a first threshold voltage, comprising:
a first gate structure over a semiconductor substrate;
first source/drain (S/D) regions in the semiconductor substrate and adjacent to opposite edges of the first gate structure, wherein the first S/D regions are free of dislocation; and
a second NMOS device with a second threshold voltage, wherein the first threshold voltage is greater than the second threshold voltage, comprising:
a second gate structure over the semiconductor substrate;
second S/D regions in the semiconductor substrate and adjacent to opposite edges of the second gate structure; and
a dislocation in the second S/D regions.

2. The device of claim 1, further comprising:
a PMOS gate structure over the semiconductor substrate;
third S/D regions in the semiconductor substrate and adjacent to opposite edges of the PMOS gate structure; and
epitaxially grown features in the third S/D regions.

3. The device of claim 2, wherein the epitaxially grown features are epi SiGe.

4. The device of claim 2, wherein the third S/D regions are free of dislocation.

5. The device of claim 1, wherein the dislocation has a depth ranging from about 10 nanometers to about 150 nanometers.

6. The device of claim 1, wherein the first NMOS device includes standard threshold voltage transistor (SVT) and/or high threshold voltage transistor (HVT).

7. The device of claim 1, wherein the second NMOS device includes low threshold voltage transistor (LVT) and/or ultra-low threshold voltage transistor (uLVT).

8. The device of claim 1, wherein the second S/D regions comprise a species of Si, Ge, Ar, Xe, C, BF2, As, In, or combinations thereof.

9. The device of claim 1, wherein the first NMOS device has a leakage current less than a leakage current of the second NMOS device.

10. The device of claim 1, wherein the first NMOS device has an operation speed less than an operation speed of the second NMOS device.

11. A semiconductor device, comprising:
a first NMOS device, comprising:
a first gate structure over a semiconductor substrate; and
first source/drain (S/D) regions in the semiconductor substrate and adjacent to opposite edges of the first gate structure, wherein the first S/D regions are free of dislocation; and
a second NMOS device, comprising:
a second gate structure over the semiconductor substrate;
second S/D regions in the semiconductor substrate and adjacent to opposite edges of the second gate structure; and
a dislocation in the second S/D regions, wherein a threshold voltage of the first NMOS device is greater than a threshold voltage of the second NMOS device; and
a PMOS device, comprising:
a third gate structure over the semiconductor substrate; and
third source/drain (S/D) regions in the semiconductor substrate and adjacent to opposite edges of the third gate structure, wherein the third S/D regions are free of dislocation.

12. The device of claim 11, wherein the third S/D regions comprise epitaxially grown features.

13. The device of claim 11, wherein the second S/D regions comprise a species of silicon (Si) or germanium (Ge).

14. The device of claim 11, wherein the dislocation is formed along a <111> direction.

15. A method of manufacturing a semiconductor device, comprising:
forming a first NMOS gate structure and a second NMOS gate structure over a substrate;
forming a protector over the first NMOS gate structure;
forming an amorphized region in the substrate adjacent to the second NMOS gate structure;
depositing a stress film over the first and the second NMOS gate structures;
performing an annealing process to form a dislocation in the substrate adjacent to the second NMOS gate structure;
removing the stress film; and
forming a first NMOS device having a first threshold voltage and source/drain region adjacent the first NMOS gate structure that is free of dislocations, and forming a second NMOS device having a second threshold voltage and having a source/drain region in which the dislocation is located, wherein the first threshold voltage is greater than the second threshold voltage.

16. The method of claim 15, wherein the stress film is silicon nitride, silicon oxide, silicon oxynitride, or combinations thereof.

17. The method of claim 15, wherein the amorphized region is formed using an implantation process with an implantation dosage of about $1\times10^{14}$ atoms/cm2 to about $2\times10^{15}$ atoms/cm2.

18. The method of claim 15, wherein the annealing process is performed by a rapid thermal annealing (RTA) process, at a temperature from about 400° C. to about 750° C., for a period of time from about 10 seconds to about 5 minutes.

19. The method of claim 15, wherein the process to form the dislocation is an annealing process performed by a spike rapid thermal annealing (spike RTA) process, at a temperature from about 990° C. to about 1050° C., for a period of time from about 0.1 seconds to about 2 seconds.

* * * * *